(12) United States Patent
Lee et al.

(10) Patent No.: US 11,037,888 B2
(45) Date of Patent: Jun. 15, 2021

(54) NITRIDE-BASED ELECTRONIC DEVICE AND METHOD FOR MANUFACTURING SAME

(71) Applicant: WAVICE Inc., Hwaseong-si (KR)

(72) Inventors: Sang Min Lee, Hwaseong-si (KR); Hwang Sub Koo, Hwaseong-si (KR); Hyun Je Kim, Hwaseong-si (KR); Hee seok Jung, Hwaseong-si (KR)

(73) Assignee: WAVICE INC., Gyeonggi-do (KR)

( * ) Notice: Subject to any disclaimer, the term of this patent is extended or adjusted under 35 U.S.C. 154(b) by 28 days.

(21) Appl. No.: 16/465,246

(22) PCT Filed: Nov. 3, 2017

(86) PCT No.: PCT/KR2017/012443
§ 371 (c)(1),
(2) Date: May 30, 2019

(87) PCT Pub. No.: WO2018/110832
PCT Pub. Date: Jun. 21, 2018

(65) Prior Publication Data
US 2019/0295962 A1    Sep. 26, 2019

(30) Foreign Application Priority Data
Dec. 13, 2016  (KR) .................. 10-2016-0169806

(51) Int. Cl.
*H01L 23/00*    (2006.01)
*H01L 21/02*    (2006.01)
(Continued)

(52) U.S. Cl.
CPC ...... *H01L 23/564* (2013.01); *H01L 21/02118* (2013.01); *H01L 21/31133* (2013.01);
(Continued)

(58) Field of Classification Search
CPC ............. H01L 29/7786; H01L 23/3171; H01L 21/76801; H01L 29/205; H01L 23/3192; H01L 29/402
See application file for complete search history.

(56) References Cited

U.S. PATENT DOCUMENTS

2011/0266670 A1    11/2011    England et al.
2012/0038058 A1    2/2012    Daumiller
(Continued)

FOREIGN PATENT DOCUMENTS

JP    2010153707 A    7/2010
JP    2013207086 A    10/2013
(Continued)

OTHER PUBLICATIONS

International Search Report and Written Opinion for PCT/KR2017/012443 dated Jan. 22, 2018, 11 pages.

*Primary Examiner* — Changhyun Yi
(74) *Attorney, Agent, or Firm* — Brundidge & Stanger, P.C.

(57) ABSTRACT

The present invention relates to a nitride-based electronic device and a method for manufacturing same, the nitride-based electronic device comprising a substrate, a metal electrode and a plurality of protection layers, wherein, among the protection layers, at least two protection layers covering one portion of the electrode so that one portion of the upper part of the electrode is exposed are configured so that the upper protection layer covers the end part of the lower protection layer so as to prevent the end part of the lower protection layer from being exposed.

7 Claims, 4 Drawing Sheets

(51) Int. Cl.

| | | |
|---|---|---|
| *H01L 21/311* | (2006.01) | |
| *H01L 21/765* | (2006.01) | |
| *H01L 23/29* | (2006.01) | |
| *H01L 23/31* | (2006.01) | |
| *H01L 29/20* | (2006.01) | |
| *H01L 29/205* | (2006.01) | |
| *H01L 29/40* | (2006.01) | |
| *H01L 29/66* | (2006.01) | |
| *H01L 29/778* | (2006.01) | |

(52) U.S. Cl.
CPC .......... *H01L 21/765* (2013.01); *H01L 23/293* (2013.01); *H01L 23/3192* (2013.01); *H01L 29/2003* (2013.01); *H01L 29/205* (2013.01); *H01L 29/402* (2013.01); *H01L 29/66462* (2013.01); *H01L 29/7787* (2013.01)

(56) References Cited

U.S. PATENT DOCUMENTS

| | | | |
|---|---|---|---|
| 2012/0220127 A1 | 8/2012 | Komatani | |
| 2015/0115411 A1* | 4/2015 | Ozaki | H01L 29/7786 257/620 |
| 2015/0214164 A1 | 7/2015 | Matocha | |
| 2016/0247740 A1* | 8/2016 | Ozaki | H01L 21/02359 |
| 2017/0330940 A1* | 11/2017 | Lee | H01L 29/408 |

FOREIGN PATENT DOCUMENTS

| | | |
|---|---|---|
| JP | 2014220463 A | 11/2014 |
| JP | 2015088666 A | 5/2015 |
| JP | 2016139718 A | 8/2016 |

\* cited by examiner

NITRIDE-BASED ELECTRONIC DEVICE AND METHOD FOR MANUFACTURING SAME

CROSS-REFERENCE TO RELATED APPLICATIONS

This Application is the National Stage filing under 35 U.S.C. § 371 of PCT Application Ser. No. PCT/KR2017/012443 filed on Nov. 3, 2017, which claims the benefit of Korean Patent Application No. 10-2016-0169806 filed on Dec. 13, 2016. The disclosures of both applications are hereby incorporated herein by reference in their entireties.

TECHNICAL FIELD

The present invention relates to a nitride-based electronic device and a method of manufacturing the same, and more particularly, to a nitride-based electronic device in which stability and reliability may be improved, and a method of manufacturing the same.

BACKGROUND ART

Generally, nitride-based electronic devices have a broad energy band gap, high thermal and chemical stability, and a high electron saturation velocity as compared with common semiconductor materials such as Si and GaAs. The nitride-based electronic devices are known to be suitable for high frequency and high capacity applications.

In the nitride-based electronic device, a channel layer and a barrier layer, which are different nitride layers, may be stacked to provide a large band discontinuity at a junction interface, and high concentration electrons may be induced due to the large band discontinuity, thereby improving electron mobility.

In the nitride-based electronic devices having such characteristics, a resin film is commonly used to prevent permeation of moisture. However, a volume of the resin film may be changed due to changes in humidity and temperature, and the change in the volume of the resin film may cause a portion of a nitride-based lower protection layer to be delaminated.

Moisture may permeate into the delaminated portion of the protection layer, and surfaces of metal electrode pads may be easily oxidized due to the permeation of the moisture, which may lower the stability and reliability of the nitride-based electronic device which uses a high voltage.

In particular, in the case of a high electron mobility transistor (HEMT) in which a via is formed in a rear side of a substrate so that an external electrode is connected to a source electrode pad and an upper surface of a drain electrode pad is exposed through an opening formed in a passivation layer and a resin film which are stacked so that an external electrode is connected to the drain electrode pad, the HEMT has a structure in which moisture is easily introduced into the drain electrode pad.

Japanese Unexamined Patent Application Publication No. 2014-220463 (published on Nov. 20, 2014, semiconductor device) discloses a structure of a semiconductor device having improved moisture resistance, and particularly, discloses a structure capable of blocking moisture from flowing into an upper side of a drain in detail.

As can be seen from the structure of FIGS. 6B and 6C of the above-described publicized patent, the semiconductor device has a structure in which a protection layer and a resin film are disposed to cover an upper portion of a drain electrode pad, an opening is formed to expose a portion of the upper portion of the drain electrode pad, and an end of the protection layer is exposed at the upper portion of the drain electrode pad.

Even if an opening irrespective of the exposure of the drain electrode pad is formed in the resin film in order to prevent the protection layer from being delaminated due to a change in volume of the resin film, fine moisture may be introduced into a gap between thin films, which results in a decrease in the stability and reliability of the device.

In addition, when the opening which exposes the drain electrode pad and the opening which prevents delamination of the protection layer are formed, due to an etch stop difference, it is very difficult to concurrently form the two openings having substantially different functions. That is, an etch stop of the opening which exposes the drain electrode pad is a drain electrode pad made of a metal, and the opening which prevents the delamination of the protection layer becomes a protection layer made of a nitride, and thus, a manufacturing process is not easy. Therefore, the two openings should be formed using separate photolithography processes, resulting in an increase in the number of process operations.

DISCLOSURE

Technical Problem

The present invention is directed to providing a structure for improving moisture resistance of a nitride-based electronic device, and a method of manufacturing the nitride-based electronic device.

In addition, the present invention is directed to providing a nitride-based electronic device in which moisture resistance may be improved and an increase in the number of process operations may be prevented, and a method of manufacturing the same.

Furthermore, the present invention is directed to providing a nitride-based electronic capable of preventing moisture from being introduced through an end of a peripheral portion of the nitride semiconductor electronic device as well as an upper side of a drain electrode pad, and a method of manufacturing the same.

Technical Solution

One aspect of the present invention provides a nitride-based electronic device including a substrate, an electrode made of a metal, and a plurality of protection layers, wherein at least two of the protection layers, which cover a portion of the electrode such that a part of an upper portion of the electrode is exposed, are configured such that an upper protection layer thereof covers an end of a lower protection layer thereof such that the end of the lower protection layer is not exposed.

A side surface portion at a chip level formed when the protection layers are stacked to be in contact with each other, the protection layer disposed at an upper level covers the end of the protection layer disposed at a lower level such that the end of the lower protection layer is not exposed.

An uppermost protection layer among the protection layers may be made of a hydrophobic resin material.

The hydrophobic resin material may be BCB (BenzoCycloButene).

The electrode may be at least a drain electrode pad and may include a field plate.

Another aspect of the present invention provides a method of manufacturing a nitride-based electronic device, the method including sequentially forming a channel layer and a barrier layer on a substrate, and alternately forming protection layers and an electrode, wherein the protection layers include at least two protection layers formed above an upper peripheral portion of the electrode, patterning is performed such that an end of a lower protection layer of the two protection layers is disposed on the electrode, and patterning is performed such that an upper protection layer of the two protection layers covers the end of the lower protection layer to prevent the end of the lower protection layer from being exposed.

The protection layers may be stacked to be in direct contact with a side surface portion at a chip level, and patterning may be performed such that an upper protection layer covers an end of a lower protection layer.

An uppermost protection layer among the protection layers may be formed by applying BCB and patterning the applied BCB.

The electrode may be at least a drain electrode pad and may selectively further include a field plate.

Advantageous Effects

According to a nitride-based electronic device and a method of manufacturing the same of the present invention, in a structure using a plurality of passivation layers and a plurality of resin layers, an upper layer covers both ends of a lower layer to prevent the ends from being exposed, thereby preventing a region between layers from being exposed so as to improve moisture resistance.

In addition, according to the present invention, a separate opening for improving moisture resistance is not formed, thereby preventing an increase in the number of process operations.

According to the present invention, a region between layers in an entire structure as well as an upper portion of an electrode pad can be prevented from being exposed, thereby further improving moisture resistance.

DESCRIPTION OF REFERENCE NUMERALS

Figure 1:
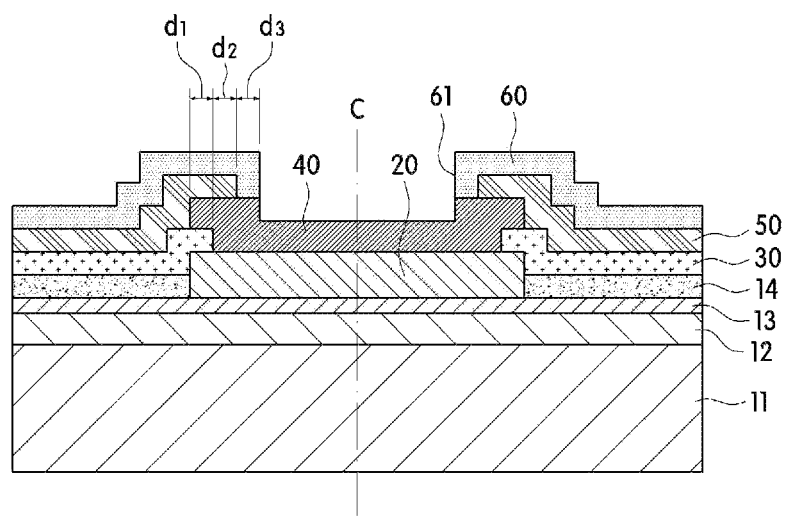
FIG. 1 is a cross-sectional view illustrating a part of a nitride-based electronic device according to a first exemplary embodiment of the present invention.

| | |
|---|---|
| 11: substrate | 12: channel layer |
| 13: barrier layer | 14: first protection layer |
| 20: drain electrode | 30: second protection layer |

-continued

| | |
|---|---|
| 40: drain electrode pad | 50: third protection layer |
| 60: fourth protection layer | 70: source electrode |
| 80: gate electrode | 90: field plate |

MODES OF THE INVENTION

Hereinafter, a nitride-based electronic device and a method of manufacturing the same according to the present invention will be described in detail with reference to the accompanying drawings. In particular, only a portion of the nitride-based electronic device may be illustrated in the drawings described so as to clearly show the characteristic configuration and operation of the present invention.

In addition, in the present invention, an example of a structure of a high electron mobility transistor (HEMT), which is an example of the nitride-based electronic device, will be described for convenience of description, but the present invention is not necessarily limited to the manufacture of the HEMT.

Exemplary embodiments of the present invention are provided to more perfectly explain the present invention to one of ordinary skill in the art. The following exemplary embodiments may be changed into various other forms, and the scope of the present invention will not be limited thereto. The following exemplary embodiments are provided to allow the present invention to be more faithful to and to fully transfer the concept of the present invention to one of ordinary skill in the art.

The terms used herein describe particular embodiments but will not limit the present invention. As used herein, singular expressions, unless defined otherwise in contexts, include plural expressions. It will be further understood that the terms "comprises" and/or "comprising" used herein specify the presence of stated shapes, numbers, steps, operations, members, elements, and/or groups thereof, but do not preclude the presence or addition of one or more other shapes, numbers, steps, operations, members, elements, and/ or groups thereof. As used herein, the term "and/or" includes any and all combinations of one or more of the associated listed items It will be understood that although the terms "first," "second," etc. may be used herein to describe various members, regions, and/or portions, these members, components, regions, layers, and/or portions should not be limited by these terms. The terms do not indicate a particular order, top and bottom, or merits and demerits but are only used to distinguish one member, region, or portion from another. Accordingly, a first element, region, or portion, which will be described below, may indicate a second element, region, or portion without deviating from teachings of the present invention.

Hereinafter, the exemplary embodiments of the present invention will be described with reference to schematic drawings showing the exemplary embodiments of the present invention. Throughout the drawings, for example, according to manufacturing technologies and/or tolerances, illustrated shapes may be modified.

Accordingly, the exemplary embodiments of the present invention will not be understood to be limited to certain shapes of illustrated regions but will include changes in shape occurring while being manufactured.

First Exemplary Embodiment

FIG. 1 is a cross-sectional view illustrating a part of a nitride-based electronic device according to a first exemplary embodiment of the present invention.

As shown in FIG. 1, the nitride-based electronic device according to the first exemplary embodiment includes a substrate 11, a channel layer 12 formed on the substrate 11, a barrier layer 13 formed on the channel layer 12, a first protection layer 14 disposed on the barrier layer 13 to expose a partial region of the barrier layer 13, a drain electrode 20 disposed on the barrier layer 13 exposed by the first protection layer 14, a second protection layer 30 disposed to cover an entire upper surface of the first protection layer 14 and a partial peripheral portion of an upper surface of the drain electrode 20, a drain electrode pad 40 disposed on the upper surface of the drain electrode 20 and a portion of the second protection layer 30 on the peripheral portion of the drain electrode 20, a third protection layer 50 configured to cover an upper portion of the second protection layer 30 and a partial peripheral portion of an upper surface of the drain electrode pad 40, and a fourth protection layer 60 configured to cover an upper portion of the third protection layer 50 and expanding to the partial peripheral portion of the upper surface of the drain electrode pad 40 such that an end of the third protection layer 50 is not exposed.

Such a configuration shows only a drain portion of the HEMT, which is an example of the nitride-based electronic device.

The substrate 11 may be made of a known material such as SiC or sapphire. The channel layer 12 is a nitride-based semiconductor layer made of GaN or the like. The barrier layer 13 is a nitride-based semiconductor layer made of AlGaN or the like. In this case, it is assumed that the channel layer 12 and the barrier layer 13 are different nitride-based semiconductor layers.

The first protection layer 14 is disposed on the barrier layer 13. An opening is formed in a portion of the first protection layer 14 to expose a portion of the barrier layer 13 of a drain region. A nitride semiconductor layer made of SiN or the like may be used as the first protection layer 14.

The drain electrode 20 is disposed to be in contact with the barrier layer 13 exposed through the opening of the first protection layer 14. The drain electrode 20 is a metal layer and is formed together with a source electrode not shown in the drawing. A method of forming the drain electrode 20 may be a lift-off method.

Next, the second protection layer 30 is disposed on the entire upper surface of the first protection layer 14 from the peripheral portion of the upper surface of the drain electrode 20 to expose a central portion of the upper surface of the drain electrode 20. Here, the entire upper surface may be an expression limited to the configuration of FIG. 1. A nitride semiconductor layer may also be used as the second protection layer 30.

In this case, the first protection layer 14 is in contact with a side surface of the drain electrode 20, and the second protection layer 30 extends to the peripheral portion of the upper surface of the drain electrode 20. Accordingly, ends of the first protection layer 14 and the second protection layer 30 are disposed at different positions.

The end of the second protection layer 30 is disposed closer to a center c of the drain electrode 20 in a vertical direction than the end of the first protection layer 14 by a distance d1 in the drawing. A total area of the second protection layer 30 is also greater than that of the first protection layer 14.

The drain electrode pad 40 is disposed to be in contact with a center of the upper surface of the drain electrode 20 that is exposed by the second protection layer 30. The drain electrode pad 40 may be formed concurrently with a field plate not shown in the drawing or may be formed through a separate process from a process of forming the field plate.

Then, the third protection layer 50 is disposed on an entire upper surface of the second protection layer 30 and the partial peripheral portion of the upper surface of the drain electrode pad 40. A nitride semiconductor layer may also be used as the third protection layer 50, and an end of the third protection layer 50 may be disposed closer to the center c of the drain electrode 20 in the vertical direction than the end of the second protection layer 30 by a distance d2.

Therefore, in an overall view, the third protection layer 50 has a structure which completely covers the second protection layer 30, and the second protection layer 30 has a structure which completely covers the first protection layer 14.

Finally, the fourth protection layer 60 is disposed to cover an entire upper surface and an end of the third protection layer 50. That is, the fourth protection layer 60 expands to the peripheral portion of the upper surface of the drain electrode pad 40 so as to cover the end of the third protection layer 50 and thus has a structure which exposes only a portion of a center of the drain electrode pad 40. Therefore, an end of the fourth protection layer 60 is disposed closer to the center c of the drain electrode 20 in the vertical center than the end of the third protection layer 50.

The fourth protection layer 60 may be made of a resin material. In particular, the fourth protection layer 60 may be made of a material that is hydrophobic and has high adherency with lower layers in order to improve moisture resistance. One example satisfying such conditions may be BCB (BenzoCycloButene).

The fourth protection layer 60 is configured to include a bent portion 61 bent toward an upper peripheral portion of the drain electrode pad 40. The end of the third protection layer 50 and a region between the fourth protection layer 60 and the third protection layer 50 are prevented from being exposed by the bent portion 61, thereby preventing moisture from being introduced.

As described above, according to the present invention, an upper protection layer may be stacked on a lower protection layer to completely cover the lower protection layer, thereby preventing moisture from being introduced.

FIGS. 2A to 2D are cross-sectional views illustrating a procedure of a process of manufacturing the nitride-based electronic device according to the first exemplary embodiment of the present invention.

Figure 2A:
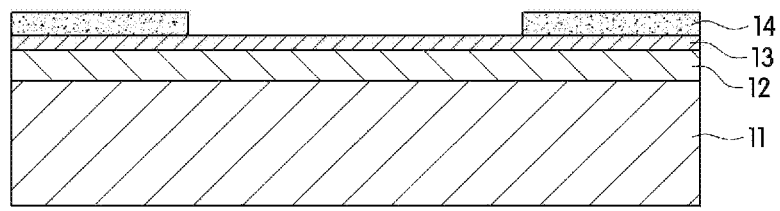
FIGS. 2A to 2D are cross-sectional views illustrating a procedure of a process of manufacturing the nitride-based electronic device according to the first exemplary embodiment of the present invention.

As shown in FIG. 2A, the channel layer 12 and the barrier layer 13 are sequentially formed on the substrate 11. The first protection layer 14 is deposited on the barrier layer 13, and then, a portion of the first protection layer 14 is selectively etched to expose a portion of an upper portion of the barrier layer 13.

In this case, the exposed barrier layer 13 becomes a drain region.

Figure 2B:
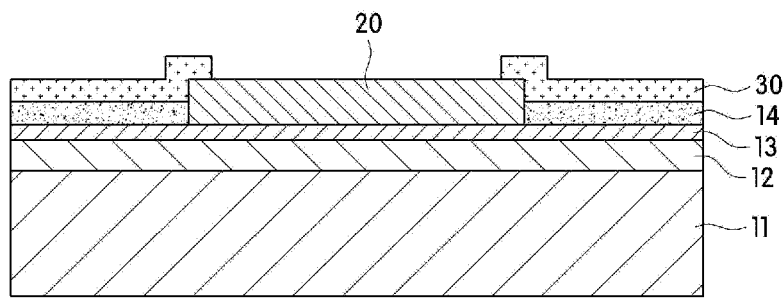

Then, as shown in FIG. 2B, the drain electrode 20 is formed through a lift-off method so as to be disposed on the barrier layer 13 exposed between the first protection layers 14.

Next, the second protection layer 30 is deposited on the entire upper surfaces of the drain electrode 20 and the first protection layer 14, and a portion of the second protection layer 30 is removed through a photolithography process to expose an upper central portion of the drain electrode 20.

Here, since the removed second protection layer 30 is a portion disposed on the upper central portion of the drain electrode 20, the second protection layer 30 is disposed along an edge of the upper surface of the drain electrode 20.

Figure 2C:
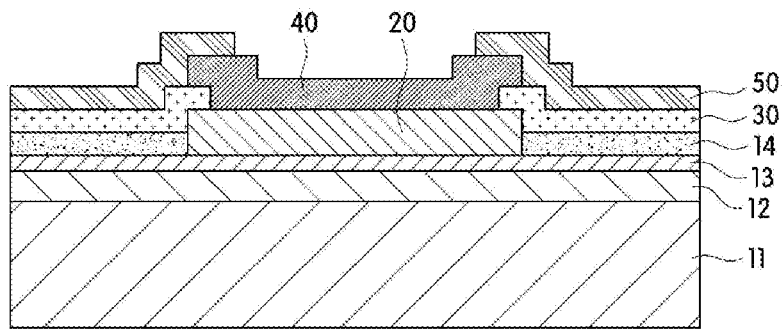

Next, as shown in FIG. 2C, the drain electrode pad 40 is formed to be in contact with the exposed portion of the drain electrode 20. The drain electrode pad 40 may be formed selectively using any method capable of forming a metal pattern layer, such as a plating method, a lift-off method, and a post-patterning deposition method.

The third protection layer 50 is then deposited on entire upper surfaces of the drain electrode pad 40 and the second protection layer 30, and a pattern is formed to expose an upper central portion of the drain electrode pad 40.

Here, the end of the third protection layer 50, which is an etched surface, has a shape protruding further toward the center of the drain electrode pad 40 as compared with the end of the second protection layer 30.

Figure 2D:
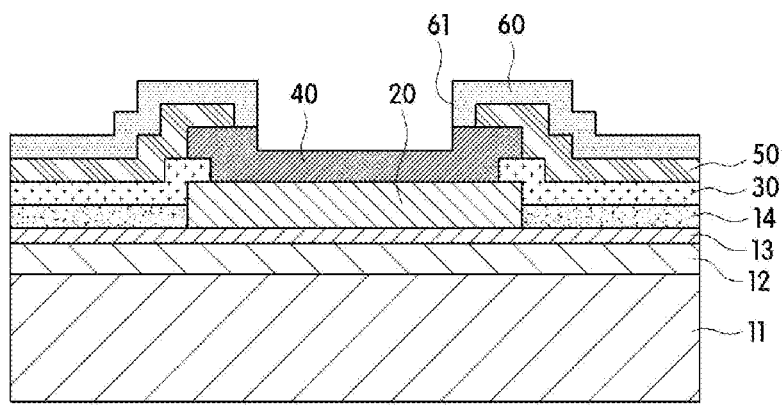

Next, as shown in FIG. 2D, a resin is applied and patterned on an entire upper surface of the resultant product of FIG. 2C to form the fourth protection layer 60 which covers the end of the third protection layer 50 and exposes a central portion of the upper surface of the drain electrode pad 40.

The fourth protection layer 60 is formed by applying hydrophobic BCB having high adherency with respect to a lower layer. The fourth protection layer 60 may prevent exposure of an end of the lower layer and a boundary between the fourth protection layer 60 and the lower layer, thereby preventing moisture from being introduced.

Second Exemplary Embodiment

Figure 3:
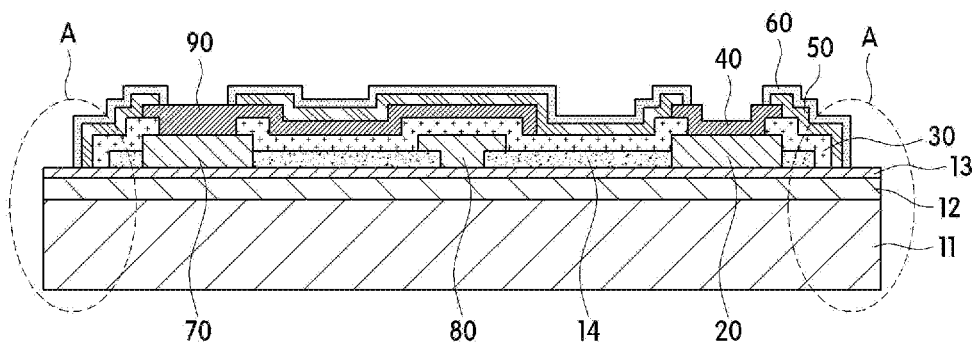
FIG. 3 is a cross-sectional view illustrating a part of a nitride-based electronic device according to a second exemplary embodiment of the present invention.

FIG. 3 is a cross-sectional view illustrating a nitride-based electronic device according to a second exemplary embodiment of the present invention.

Referring to FIG. 3, the nitride-based electronic device according to the second exemplary embodiment of the present invention is illustrated as further including a source electrode 70, a gate electrode 80, and a field plate 90 unlike the first exemplary embodiment shown in FIG. 1

FIG. 3 shows that, in a stacked structure of multiple protection layers, which is a characteristic configuration of the present invention, structures of upper protection layers, which completely cover protection layers disposed thereunder, are not limited to being formed on a drain electrode pad.

It may be understood that the field plate 90, which is in contact with an upper portion of the source electrode 70 and extends to an upper portion of a second protection layer 30 above the gate electrode 80, also functions as a source electrode pad (not divided in the drawing).

The third protection layer 50 and a fourth protection layer 60 are stacked on the field plate 90 similar to the drain electrode pad 40. A central portion of an upper surface of the field plate 90 may be exposed such that an external electrode is connected to the field plate 90.

In this case, the fourth protection layer 60 disposed on the field plate 90 also has a structure which completely covers an end of the third protection layer 50 to prevent the end of the third protection layer 50 from being exposed. A region, in which the source electrode 70 and the field plate 90 are formed, has a structure in which a first protection layer 14, a second protection layer 30, the third protection layer 50, and the fourth protection layer 60 are sequentially stacked as in a region in which the drain electrode 20 is formed, which is described above in detail. An upper protection layer protrudes closer to a central side of the source electrode 70 than a protection layer thereunder.

Region A in FIG. 3 is a region adjacent to a boundary portion between elements at a wafer level. When a substrate 11 is cut later, region A forms a side surface portion at a chip level. A side surface portion of an actual nitride-based electronic device at a chip level has a very complicated structure including a plurality of source electrodes 70, a plurality of drain electrodes 20, and a plurality of gate electrodes 80, but it may be understood that the side surface portion is simplified to be shown in FIG. 3.

Region A in FIG. 3 has a structure in which the first protection layer 14, the second protection layer 30, the third protection layer 50, and the fourth protection layer 60 are sequentially stacked so as to be in direct contact with each other. In particular, a notable feature is a stacked structure in which the second protection layer 30 covers an end of the first protection layer 14 to prevent the end of the first protection layer 14 from being exposed and the third protection layer 50 covers an end of the second protection layer 30 to prevent the end of the second protection layer 30 from being exposed.

In addition, the fourth protection layer 60 made of a resin material may cover the end of the third protection layer 50 to prevent the end of the third protection layer 50 from being exposed, thereby preventing moisture from being introduced from a side surface portion of the nitride-based electronic device.

Portions of the first protection layer 14, the second protection layer 30, the third protection layer 50, and the fourth protection layer 60 may have a structure which is in direct contact with a barrier layer 13 and may prevent moisture from being introduced from the side surface portion of the nitride-based electronic device.

FIGS. 4A to 4D are cross-sectional views illustrating a procedure of a process of manufacturing the nitride-based electronic device according to the second exemplary embodiment of the present invention.

Figure 4A:
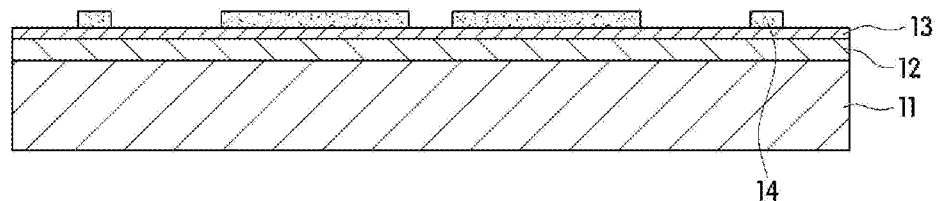
FIGS. 4A to 4D are cross-sectional views illustrating a procedure of a process of manufacturing the nitride-based electronic device according to the second exemplary embodiment of the present invention.

As shown in FIG. 4A, a channel layer 12 and the barrier layer 13 are sequentially formed on the substrate 11. The first protection layer 14 is deposited on the barrier layer 13, and then, a portion of the first protection layer 14 is selectively etched to expose a portion of an upper portion of the barrier layer 13.

In this case, the exposed barrier layer 13 becomes a drain region and a source region.

In addition, a portion of the first protection layer 14, which is disposed at a side surface portion of the nitride-based electronic device at a chip level, is removed to expose an end of the first protection layer 14.

Figure 4B:
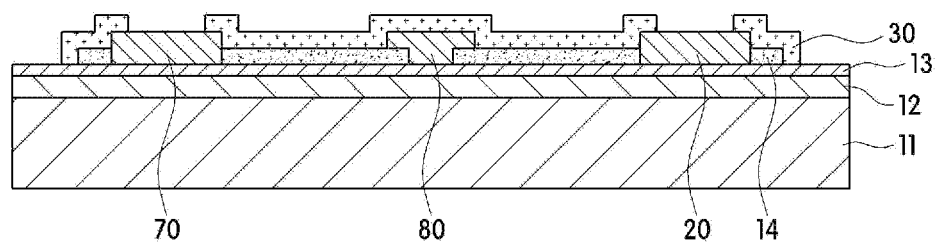

Then, as shown in FIG. 4B, the drain electrode 20 and the source electrode 70 are formed on the barrier layer 13 exposed by an exposed region of the first protection layer 14 through a lift-off method.

A portion of the first protection layer 14 between the drain electrode 20 and the source electrode 70 is etched to expose the barrier layer 13 under the first protection layer 14 and then form the gate electrode 80 in contact with the exposed barrier layer 13.

Next, the second protection layer 30 is deposited on entire upper surfaces of the drain electrode 20, the source electrode 70, the gate electrode 80, and the first protection layer 14, and a portion of the second protection layer 30 is removed through a photo lithography process to expose upper central portions of the drain electrode 20 and the source electrode 70 and also cover the exposed end of the first protection layer 14 at the side surface portion of the nitride-based electronic device at the chip level to prevent the end of the first protection layer 14 from being exposed.

Figure 4C:
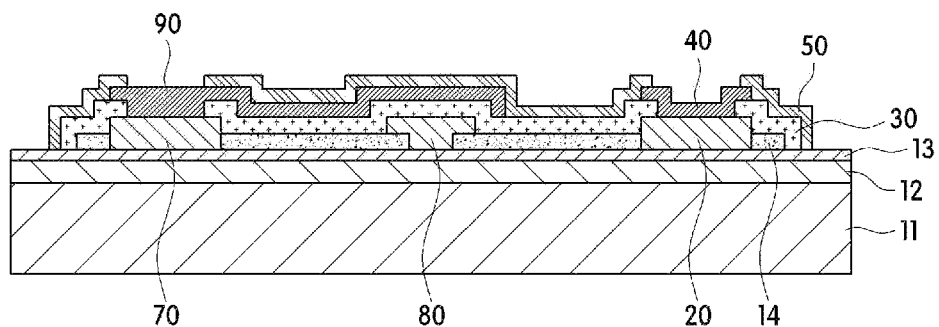

Next, as shown in FIG. 4C, the field plate 90 and the drain electrode pad 40 are formed so as to be in contact with exposed portions of the source electrode 70 and the drain electrode 20. The field plate 90 and the drain electrode pad 40 may be formed selectively using any method capable of forming a metal pattern layer, such as a plating method, a lift-off method, or a post-patterning deposition method.

The third protection layer 50 is then deposited on entire upper surfaces of the field plate 90, the drain electrode pad 40, and the second protection layer 30, and a pattern is formed to expose upper central portions of the field plate 90 and drain electrode pad 40. An end of the second protection layer 30, which is exposed at the side surface portion of the nitride-based electronic device at the chip level, is covered so as to not be exposed.

Here, the end of the third protection layer 50, which is an etched surface, has a shape protruding further toward a center of the drain electrode pad 40 and a center of the field plate 90 as compared with the end of the second protection layer 30.

Figure 4D:
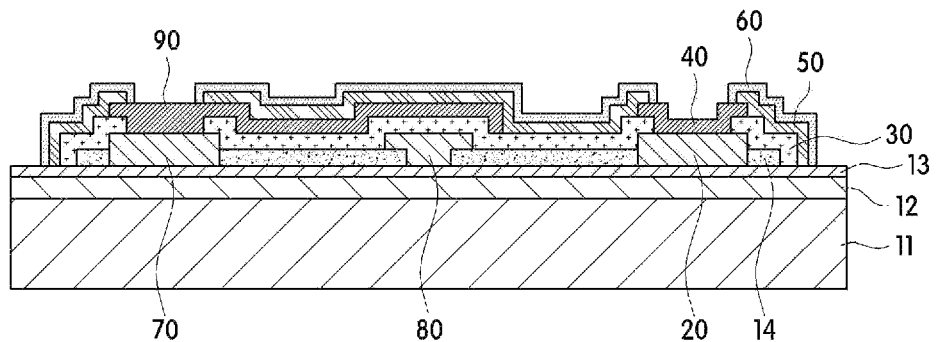

Next, as shown in FIG. 4D, a resin is applied and patterned on an entire upper surface of the result product of FIG. 4C to cover the end of the third protection layer 50 disposed on the field plate 90 and the drain electrode pad 40 and also the end of the third protection layer 50 exposed at the side surface portion of the nitride-based electronic device at the chip level to prevent the ends of the third protection layer 50 from being exposed.

The fourth protection layer 60 is formed by applying hydrophobic BCB having high adherency with respect to a lower layer. The fourth protection layer 60 may prevent exposure of an end of the lower layer and a boundary between the fourth protection layer 60 and the lower layer, thereby preventing moisture from being introduced.

The present invention is not limited to the exemplary embodiments, but it will be apparent to those skilled in the art that various modification and changes may be made without departing from the scopes and spirits of the present invention.

INDUSTRIAL APPLICABILITY

The present invention provides a nitride-based electronic device in which stability and reliability can be improved and a method of manufacturing the same.

The invention claimed is:

1. A nitride-based electronic device, comprising:
a substrate;
a channel layer and a barrier layer sequentially formed on the substrate;
a source electrode, a gate electrode, and a drain electrode are disposed between respective side surface portions at a chip, wherein each of the source electrode, the gate electrode, and the drain electrode is made of a metal; and
a plurality of protection layers comprising at least an upper protection layer and a lower protection layer,
wherein the upper and lower protection layers cover an entire top surface of the gate electrode,
wherein the upper and lower protection layers cover an edge portion of each top surface of the source electrode and the drain electrode, and a center portion of each top surface of the source electrode and the drain electrode is not covered by the upper and lower protection layers,
wherein a side surface of the lower protection layer is disposed on each of the source electrode and the drain electrode, the upper protection layer includes a bent portion bent toward an upper peripheral portion of each of the source electrode and the drain electrode, and the bent portion of the upper protection layer covers the side surface of the lower protection layer such that the side surface of the lower protection layer is not exposed, and
wherein, at a side surface portion located at an edge of the chip formed when the plurality of protection layers are stacked to be in contact with each other, respective ends of the plurality of protection layers are in direct contact with the barrier layer, and the upper protection layer covers an end of the lower protection layer such that the end of the lower protection layer is not exposed.

2. The nitride-based electronic device of claim 1, wherein an uppermost protection layer among the plurality of protection layers is made of a hydrophobic resin material.

3. The nitride-based electronic device of claim 2, wherein the hydrophobic resin material is BCB (BenzoCycloButene).

4. The nitride-based electronic device of claim 1, further comprising, a drain electrode pad and a field plate.

5. A method of manufacturing a nitride-based electronic device, the method comprising:
sequentially forming a channel layer and a barrier layer on a substrate;
forming a source electrode, a gate electrode, and a drain electrode that are disposed between respective side surface portions at a chip, wherein each of the source electrode, the gate electrode, and the drain electrode is made of a metal;
forming a plurality of protection layers that comprise at least an upper protection layer and a lower protection layer, wherein:
the upper and lower protection layers cover an entire top surface of the gate electrode,
the upper and lower protection layers cover an edge portion of each top surface of the source electrode and the drain electrode, and a center portion of each top surface of the source electrode and the drain electrode is not covered by the upper and lower protection layers, and
a side surface of the lower protection layer is disposed on each of the source electrode and the drain electrode, the upper protection layer includes a bent portion bent toward an upper peripheral portion of each of the source electrode and the drain electrode, and the bent portion of the upper protection layer covers the side surface of the lower protection layer such that the side surface of the lower protection layer is not exposed; and
patterning such that at a side surface portion located at an edge of the chip formed when the plurality of protection layers are stacked to be in direct contact with each other:
the upper protection layer covers an end of the lower protection layer to prevent the end of the lower protection layer from being exposed, and
respective ends of the upper and lower protection layers are in direct contact with the barrier layer.

6. The method of claim 5, wherein an uppermost protection layer among the plurality of protection layers is formed by applying and patterning BCB (BenzoCycloButene).

7. The method of claim 5, further comprising, forming a drain electrode pad and a field plate.

* * * * *